United States Patent [19]
Takahashi

[11] Patent Number: 5,949,159
[45] Date of Patent: Sep. 7, 1999

[54] IDLE CURRENT CORRECTING CIRCUIT AND LOW VOLTAGE DRIVE TYPE ELECTRONIC APPLIANCE

[75] Inventor: Chusei Takahashi, Tokyo, Japan

[73] Assignee: OKI Electric Industry Co., Ltd., Tokyo, Japan

[21] Appl. No.: 08/872,061

[22] Filed: Jun. 10, 1997

[30] Foreign Application Priority Data

Jul. 19, 1996 [JP] Japan ..................................... 8-190489

[51] Int. Cl.⁶ .................................................. H01H 35/00
[52] U.S. Cl. ............................ 307/130; 307/125; 307/113
[58] Field of Search .................................... 307/112, 113, 307/116, 125, 130, 111; 330/127, 128, 129, 130, 279

[56] References Cited

U.S. PATENT DOCUMENTS

| | | | |
|---|---|---|---|
| 4,785,295 | 11/1988 | Fukui et al. .............................. | 340/679 |
| 5,406,225 | 4/1995 | Iida et al. ................................. | 330/279 |
| 5,432,473 | 7/1995 | Mattila et al. ........................... | 330/133 |

*Primary Examiner*—Jeffrey Gaffin
*Assistant Examiner*—Jonathan S. Kaplan
*Attorney, Agent, or Firm*—Venable; Robert J. Frank; Michael A. Sartori

[57] ABSTRACT

An idle current supplying path is switched during correction operation and during normal operation to detect a magnitude of an idle current flowing through a power amplifying circuit when the correction operation is switched. A bias voltage of the power amplifying circuit is corrected based upon the idle current detecting result. The bias voltage is automatically corrected in such a manner that the magnitude of the idle current flowing through the power amplifying circuit is made coincident with a predetermined current value. As a consequence, the idle current flowing through the respective power amplifying circuit can be continuously maintained to the optimum values respective of to the element deviation.

6 Claims, 2 Drawing Sheets

IDLE CURRENT CORRECTING CIRCUIT AND LOW VOLTAGE DRIVE TYPE ELECTRONIC APPLIANCE

BACKGROUND OF THE INVENTION

1. Field of the Invention

The present invention relates to a low voltage drive type electronic appliance containing a power amplifying circuit. Also, the present invention concerns an idle current correcting circuit for correcting an idle current flowing through the power amplifying circuit employed in the low-voltage operable electronic appliance.

2. Description of the Related Art

A power amplifying circuit is a circuit capable of maintaining minimum distortion in an output signal with respect to an input signal by efficiently utilizing a linear operating region of a transistor. To this end, a value of an idle current capable of defining an operating point of the transistor must be kept as an optimum idle current value.

However, there are some cases where idle current values are varied due to adverse influences caused by element deviation. As a consequence, one conventional method has been utilized. That is, a power transistor having superior linearity is selected as the power transistor employed for this type of power amplifier circuit. Furthermore, a high voltage is applied to the selected power transistor so as to secure the necessary high linearity thereof.

Recently, however, voltages of power sources which are available in portable electronic appliances, such as digital portable telephones, are decreasing less and less. Although there is no change in the linearity requirements, the lower power source voltages for the amplifying circuits of these portable electronic appliances are being used.

As a consequence, setting the initial operation values for the idle currents for the element deviation may constitute the major point for securing better linearities for these power amplifying circuits. To set the idle current the following setting methods can be used, for example, the idle current can be fixed by the average value of the element deviation, and the initial idle current can be fixed by individual manual adjustment.

However, the method for manually adjusting the change in the idle current caused by the element deviation of the amplifying circuit requires a lengthy work time and also skilled techniques. Also, this manual adjusting method of the idle current inevitably increases the work steps, which inevitably requires adjustment devices, and therefore is not suitable for mass production. Nevertheless, if the idle current is not changed, then the power consumption is accordingly increased. As a consequence, the idle current must be properly controlled.

SUMMARY OF THE INVENTION

In accordance with the present invention, there is provided a switching means for switching an idle current supplying path during correction operation and during normal operation. A resistor is employed which produces a voltage having a magnitude corresponding to a magnitude of an idle current flowing the idle current supplying path for the correction operation. Furthermore, there are provided a detecting means for detecting the voltage produced from the resistor, and a control means for correcting a bias voltage of a power amplifying circuit based upon the detection result of the detecting means in such a manner that the magnitude of the idle current flowing through the power amplifying circuit is made coincident with a predetermined current value. Thus, these circuit elements comprise an idle current correcting circuit according to the present invention.

Since the detecting means detects whether or not the idle current flowing through each of the power amplifying circuits is shifted, or deviated from the optimum value and then this shift can be automatically corrected by way of the control of the control means, the idle current can be optimized, as compared with a conventional case in which the correction amount is fixed to the average value of the element deviation. Moreover, the working time and the working load can be reduced, as compared with those of the manual operation.

Since the low voltage drive type electronic appliance is constituted by the above-described idle current correcting circuit and the power amplifying circuit for power-amplifying the input signal to output the amplified input signal, the performance of the low voltage drive type electronic appliance can be improved.

BRIEF DESCRIPTION OF THE DRAWINGS

For a better understanding of the present invention, reference is made to the following detailed description to be read in conjunction with the accompanying drawings, in which.

DESCRIPTION OF THE PREFERRED EMBODIMENTS (A) First Embodiment Mode

Referring now to drawings, a power amplifying circuit equipped with an idle current correcting function, according to a first embodiment mode of the present invention, will be described.

(A-1) Arrangement of the First Embodiment Mode

Figure 1:
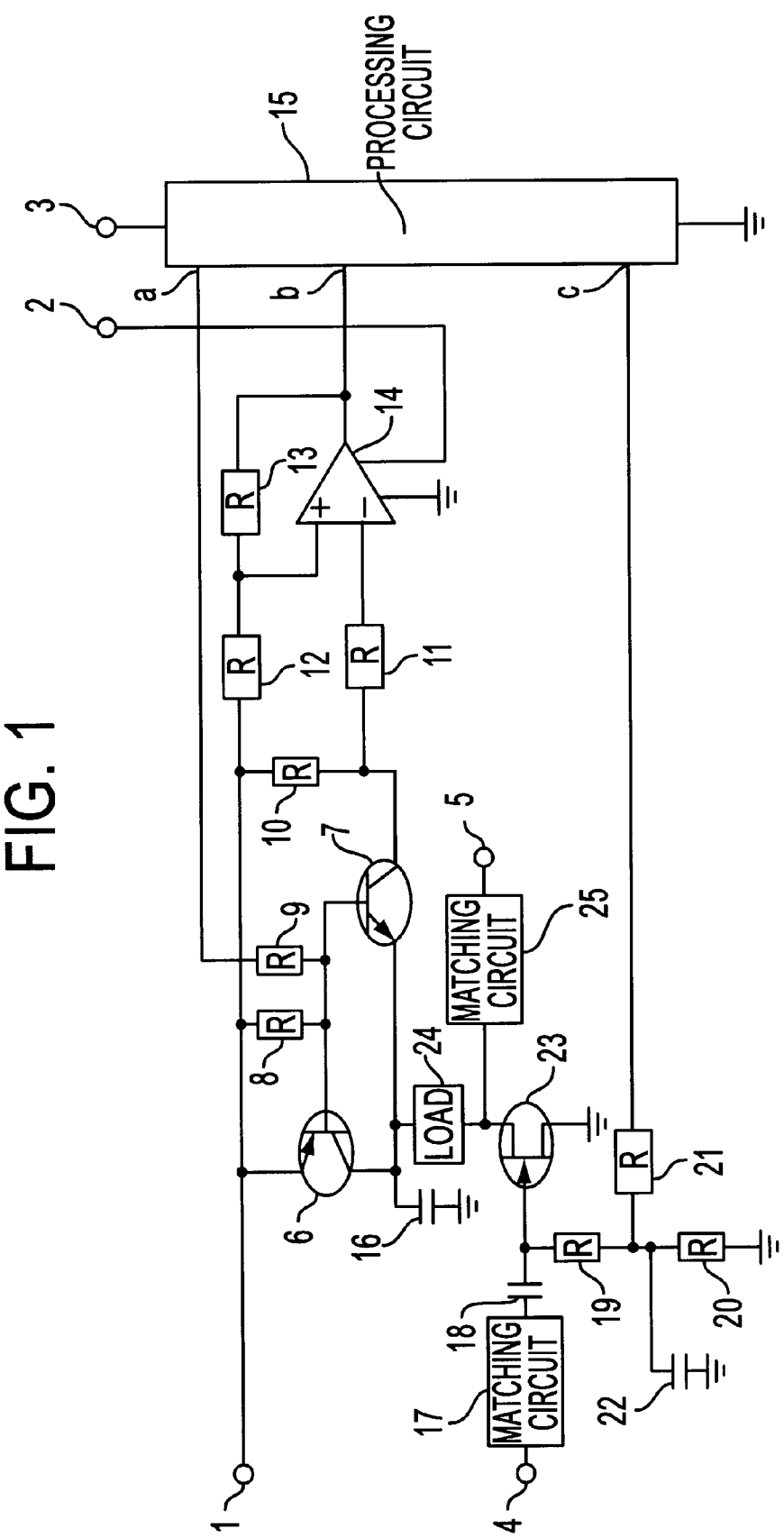
FIG. 1 is a circuit diagram for a power amplifying circuit with an idle current correcting function according to an embodiment of the present invention.

FIG. 1 is a circuit diagram for showing a power amplifying circuit according to the first embodiment mode. In this drawing, the power amplifying circuit comprises a transistor 23, a high frequency (radio frequency) load 24, and resistors 19, 20, and 21. The idle current correcting circuit is constituted by switching transistors 6, 7, a resistor 10, voltage drop detecting units 11 to 14, and a processing circuit 15.

Now, the respective structural elements of these two circuits will be explained. It should be noted that reference numerals 1, 2, and 3 indicate power source voltage supplying terminals, to which preselected power source voltages are applied. Also, reference numeral 4 represents a signal input terminal to the power amplifying circuit, and reference numeral 5 denotes a signal output terminal thereof.

First, the structural elements of the idle current correcting circuit will now be explained.

The switching transistors 6 and 7 constitute a switching circuit for switching a path for an idle current supplied to the power amplifying circuit during the normal operation, and the correcting operation. These two transistors 6 and 7 have opposite polarities to each other, so that when one of these switching transistors 6 and 7 is turned ON in response to a control voltage applied thereto via the fixed resistor 9, the other transistor is turned OFF. It should be noted that the idle current flows from the power source line connected to the power source voltage supplying terminal 1 into the turned-ON transistor.

The fixed resistor 8 is a resistor used to apply a base voltage to the switching transistor 6.

Another fixed resistor 10 is used for producing a voltage drop during the correcting operation. This voltage drop corresponds to the magnitude of the idle current flowing through the switching transistor 7. It should also be noted that other fixed resistors 11, 12, and 13 provide predetermined gains to an operational amplifier 14 in conjunction with the above-described fixed resistor 10.

The operational amplifier 14 is used for amplifying a voltage produced across the fixed resistor 10 by a ratio of the resistor 12 to the resistor 13. This operational amplifier 14 functions as a detecting unit for detecting a voltage drop in conjunction with the fixed resistors 10 to 13, and this voltage drop corresponds to the magnitude of the idle current.

The processing circuit 15 compares a DC output voltage from the operational amplifier 14 received at a terminal "b" with a reference voltage, and controls the voltage being applied to the fixed resistor 21 in such a manner that the value of the idle current becomes a predetermined value. It should also be noted that, although not shown in detail in FIG. 1, the processing circuit 15 is actually implemented with an A/D converter, a microprocessor, a ROM, a RAM, and the like.

Next, the structural elements of the power amplifying circuit will now be described.

First, a capacitor 16, one end of which is connected to a common junction point between the switching transistor 6 and the switching transistor 7, functions as a high frequency bypass capacitor.

A matching circuit 17 is connected to an input terminal 4 for unpitying a high frequency (radio frequency) signal. The matching circuit 17 is used to match an impedance of a signal source (not shown) connected to the input terminal 4 with another impedance of the transistor 23.

A DC blocking capacitor 18 is used for removing a DC signal component from the high frequency signal applied to the input terminal 4, and thus for applying only an AC signal component of the high frequency signal to the transistor 23.

The fixed resistors 19, 20, and 21 are for applying a certain voltage as a bias voltage to the gate of the transistor 23. This bias voltage is produced by properly subdividing the DC control voltage applied from the processing circuit 15.

A capacitor 22 is used for bypassing a high frequency voltage.

A high frequency load 24 corresponds to a load constructed of either a tuned circuit or a non-tuned circuit, from which a voltage obtained by amplifying the input signal in a linear manner is produced.

Another matching circuit 25 is used to match an impedance of a load (not shown) connected to the output terminal 5 is matched with an impedance of a neutral point among the transistor 23, the high frequency load 24, and the transistor 23.

(A-2) Operation of First Embodiment

A description will now be made of a correcting operation for an idle current executed in the power amplifying circuit using the above-described circuit arrangement. The idle current correcting operation is summarized in a flow chart shown in FIG. 2. The operation of the power amplifying circuit commences after the idle current is corrected.

Figure 2:
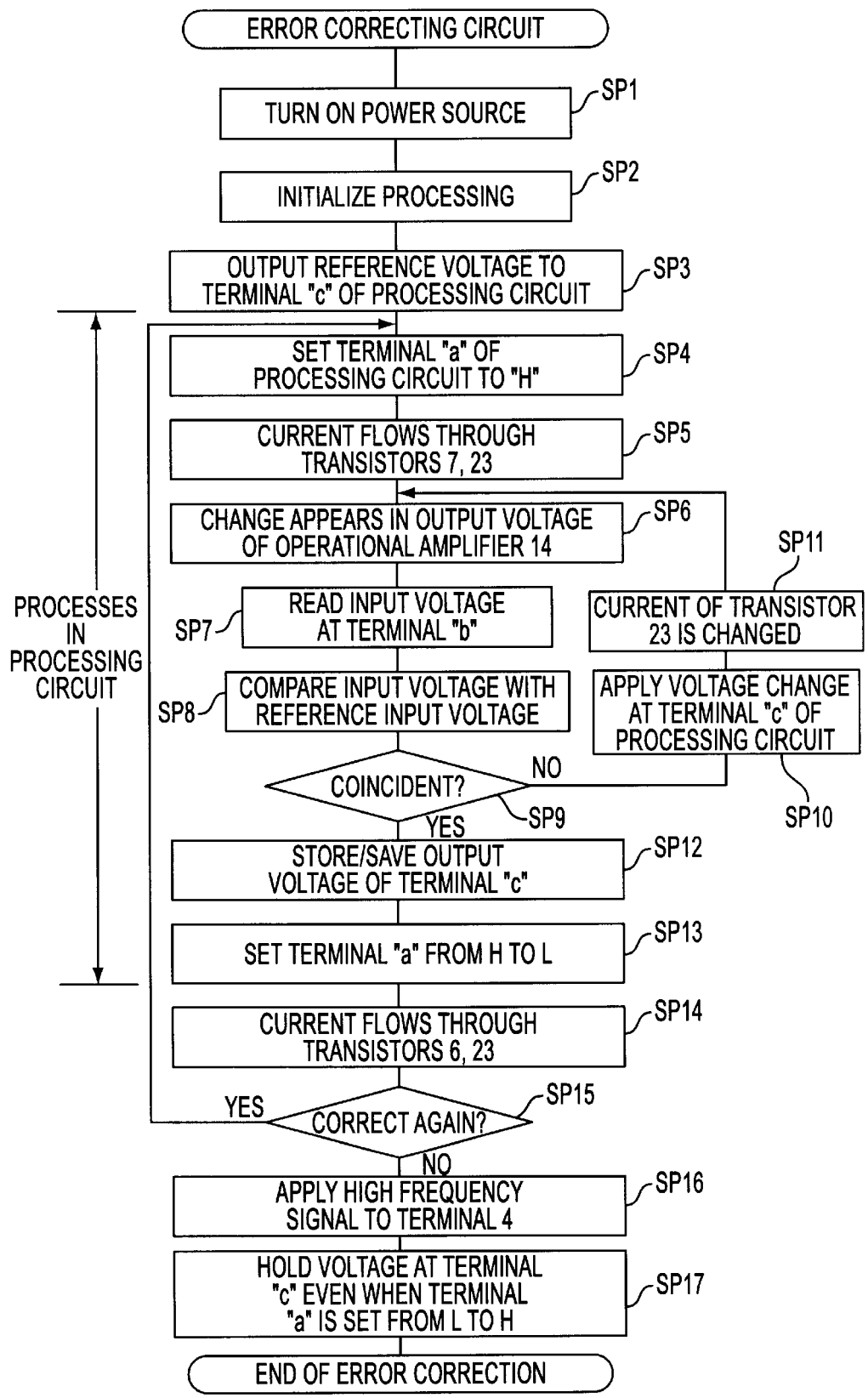
FIG. 2 is a flow chart for describing idle current correcting operations executed in the power amplifying circuit of FIG. 1.

First, as shown in a step SP1 of FIG. 2, when the power source is turned ON, preselected power source voltages are applied from the respective power source voltage supplying terminals 1, 2, and 3 to the respective circuit portions. At the subsequent step SP2, the processing circuit 15 executes an initial operation in accordance with process commands previously programmed in the ROM.

Then, at the next step SP3, a voltage appearing at the terminal "c" is set to be substantially equal to the ground potential "0V". At a step SP4, a voltage (will be referred to as an "H" hereinafter) appearing at the terminal "a" is set to be substantially equal to the voltage of the power source voltage supplying terminal 1.

It should be noted that the processing circuit 15 neglects the voltage at the terminal "b" at this time. Also, the ROM contains a table for previously storing data related to the reference input voltage and the relative voltage at the terminal "a", corresponding to the idle current, and also another table for previously storing data related to the reference output voltage and the relative voltage at the terminal "c". Alternatively, these data may be calculated every time the initial operation is carried out. Furthermore, it is assumed that no high frequency signal is supplied to the input terminal 4 in the beginning.

As described above, when the voltage appearing at the terminal "a" of the processing circuit 15 is transferred from "L" to "H", the switching transistor 7 is turned ON. Thus, as indicated at a step SP5, a current will flow from the power source voltage supplying terminal 1 via the fixed resistor 10, the switching transistor 7, and the tuned circuit 24 to the transistor 23.

At this time, since a voltage drop corresponding to the magnitude of this idle current is produced at the fixed resistor 10, as shown in a step SP6, a change appears in the output voltage of the operational amplifier 14 for amplifying this potential difference at a predetermined gain. It should be noted that the output voltage becomes lower than the voltage appearing at the power source voltage supplying terminal 1. Now a relationship of the output voltage "Vo" may be substantially obtained by the following formula, assuming that the resistance value of the fixed resistor 12 is R12, and the resistance value of the fixed resistor 13 is R13:

$$Vo = Vi - [V10 \times ((R12 + R13)/R12)].$$

Thereafter, the idle current correcting operation is advanced to a step SP7 at which the processing circuit 15 reads a change in the output of the operational amplifier 14 as a change in the input voltage of the terminal "b". This voltage is converted by the A/D converter into a digital data bit, and subsequently, the digital data bit is compared with the content of the above-described reference input voltage table at a step SP8.

Now, if the digital data bit is not coincident with the reference input voltage (namely, the comparison result is "NO" at step SP9), the processing circuit 15 judges whether the input voltage is higher than the reference value, or lower than the reference value. The processing circuit 15 reads out a proper data bit corresponding to the judgment result from the relative voltage table. Then, as shown in a step SP10, this data is converted by the D/A converter into an analog DC voltage which is applied to the output terminal "c" of the processing circuit 15.

This DC voltage is applied via the fixed resistors 19, 20, and 21 to the transistor 23, and then appears as the voltage drop of the fixed resistor 21. As indicated at a step SP11, a change in this bias voltage will appear as a change in the idle current flowing through the transistor 23.

Thereafter, the process operation of the processing circuit 15 is again returned to the step SP6 at which a check is again made as to whether or not there is a proper change in the output voltage of the operational amplifier 14 caused by the changed idle current. This operation is repeated until the reference voltage can be secured, namely the idle current of the transistor 23 can be secured.

Thereafter, when it is confirmed that the coincident result can be obtained at the step SP9 and the reference voltage can be secured, the process operation of the processing circuit 15 is advanced to a step SP12. At step SP12, a digital data bit corresponding to a value obtained by adding the voltage drop appearing at the fixed resistor 10 to the output voltage produced at this time is written into the RAM so as to be saved. At the same time, a data bit corresponding to this reference output voltage is read out from the reference output voltage table and supplied to the terminal "c".

Thereafter, the process operation of the processing circuit 15 is advanced to a process operation defined at a step SP13. At this step SP13, the potential appearing at the terminal "a" is changed from "H" into "L", and the operating condition is transferred from the correcting operation to the normal operation. In other words, at this time, as indicated at a step SP14, the switching transistor 6 is turned ON, so that an idle current flows from the power source voltage supplying terminal 1 via the switching transistor 6 and the high frequency load 24 to the transistor 23.

It should be noted that, at this time, the output voltage at the terminal "c", which determines the bias voltage of the transistor 23 for constituting the power amplifying circuit, has been corrected, taking into account the voltage drop appearing at the fixed resistor 10. Thus, the idle current has a preset magnitude and flows without any change in its magnitude through the transistor 23. This current is a drain current of the transistor 23, and is also an optimum idle current.

If the idle current is desired to be corrected again at this time, the coincident result is obtained at step SP15, and then the process operation is returned to step SP4 at which the above-explained process operation is repeatedly carried out.

On the other hand, when the correcting operation is not required, the process operation is advanced to a step SP16. Then, at this stage, the high frequency signal voltage is applied to the input terminal 4. As a consequence, such an amplified signal having the supreme linearity input/output characteristic without any element deviation is outputted via the output terminal 5.

It should be also be noted that as indicated at the step SP17, the voltage appearing at the terminal "c" may be held under this condition, even when the potential appearing at the terminal "a" is switched from "L" to "H", or from "H" to "L".

As previously explained, the operations of the power amplifying circuit with the idle current correcting function have been described.

(A-3) Effects of First Embodiment Mode

As explained above, in accordance with the first embodiment mode, the magnitude of the idle current of the transistor 23, which determines the linearity of the power amplifying circuit, can be corrected based upon the comparison result between the reference value and the magnitude of the idle current detected as the voltage drop from the fixed resistor 10 by previously switching the switching transistors 6 and 7. As a consequence, the operating points of the respective power amplifying circuit can be set to the optimum conditions irrespective of the fluctuations in the performance of the respective circuit elements.

Accordingly, the potential linearities of the transistors can be best utilized, so that a large number of linear regions can be secured, and therefore the mutual modulation distortion can be improved.

(B) Other Embodiment Modes (B-1) Although the circuit arrangement of the power amplifying circuit having the idle current correcting function has been described with reference to the circuit arrangement shown in FIG. 1 as the first embodiment mode, the present invention is not limited thereto, but may be modified, or changed as follows.

For instance, as to the above-described switching transistors 6 and 7, the transistors have the opposite polarities with each other, and are controlled by the common control signal so as to be turned ON/OFF. Alternatively, transistors having the same polarities can be used, and each of these transistors can be driven in response to each of different control signals. It should be understood that if these transistors can be selectively switched, then other arrangements may be employed.

Also, the voltage whose magnitude corresponds to the idle current is derived from the fixed resistor 10 connected between the switching transistor 7 and the power source voltage supplying terminal 1. Alternatively, this fixed resistor 10 can be inserted between the switching transistor 7 and the high frequency load 24, and a predetermined voltage may be derived by way of the fixed resistor at this location.

(B-2)

In the above-described embodiment, only the power amplifying circuit has been explained. Alternatively, the DC power amplifying apparatus according to the present invention may be applied to various electronic appliances operable under low voltages.

For instance, the DC power amplifying circuit according to the present invention can be applied to portable telephones and portable data terminals using low voltage batteries, which would require improvements in the respective mutual modulation distortions caused by the third distortion with respect to the power amplifying circuit.

As previously described in detail, in accordance with the present invention, the idle current supplying path is switched during the correction operation and during the normal operation, and the bias voltage for the power amplifying circuit is corrected based upon the magnitude detecting result of the idle current flowing during this correction operation, so that the magnitude of the idle current flowing through this power amplifying circuit is made coincident with a predetermined current value. As a result, the idle currents flowing through the respective power amplifying circuits can be continuously corrected as the optimum values. Therefore, the idle currents can be optimized, as compared with the conventional case wherein the correction amount is fixed to the average value of the element deviation. Moreover, the working time and the working load can be reduced, as compared with those of the manual operation.

If the low voltage drive type electronic appliance is used with the above-described idle current correcting circuit and the power amplifying circuit for power-amplifying the input signal to output the amplified input signal, the performance of the low voltage drive type electronic appliance can be improved.

What is claimed is:

1. An idle current correcting circuit comprising:
  switching means for switching an idle current supplying path for an idle current between a correction operation and a normal operation;
  a resistor provided in the idle current supplying path for the correction operation, for producing a voltage having a magnitude corresponding to a magnitude of the idle current;

detecting means for detecting the voltage produced by said resistor and providing a detection result; and control means for correcting a bias voltage of a power amplifying circuit based upon the detection result of said detecting means such that the magnitude of the idle current flowing through said power amplifying circuit is coincident to a predetermined current value.

2. An idle current correcting circuit as claimed in claim 1, wherein:

said control means applies a correction amount in accordance with a difference in the idle current supplying path to the bias voltage of said power amplifying circuit when the correction operation is switched to the normal operation.

3. A low voltage driven electronic appliance comprising:

a power amplifying circuit for power-amplifying an input signal and outputting the power-amplified input signal;

switching means for switching an idle current supplying path for an idle current between a correction operation and a normal operation;

a resistor provided in the idle current supplying path for the correction operation, for producing a voltage having a magnitude corresponding to a magnitude of the idle current;

detecting means for detecting the voltage produced by said resistor and providing a detection result; and control means for correcting a bias voltage of the power amplifying circuit based upon the detection result of said detecting means such that the magnitude of the idle current flowing through said power amplifying circuit is coincident to a predetermined current value.

4. A low voltage driven electronic appliance as claimed in claim 3, wherein:

said control means applies a correction amount in accordance with a difference in the idle current supplying path to the bias voltage of said power amplifying circuit when the correction operation is switched to the normal operation.

5. An idle current correcting circuit for correcting an idle current flowing through a power amplifying circuit having a bias voltage, said idle current correcting circuit comprising:

a switching circuit for receiving an idle current and switching an idle current supplying path between a correction state and a normal state;

a resistor coupled to the idle current supplying path and the idle current during said correction state and for providing a voltage having a magnitude corresponding to a magnitude of the idle current during said correction state;

a detecting circuit coupled to said resistor for detecting the voltage of said resistor and providing a detecting result;

a control circuit coupled to said switching circuit, said detecting circuit, and said power amplifying circuit, said control circuit determining when to switch between said correction and normal states, and for correcting the bias voltage of said power amplifying circuit using the detecting result of said detecting circuit such that the idle current flowing through said power amplifying circuit is equivalent to a predetermined idle current value.

6. An idle current correcting circuit as claimed in claim 5, wherein:

said control circuit applies a correction amount to the bias voltage of said power amplifying circuit when said correction state is switched to said normal state.

\* \* \* \* \*